United States Patent
Brencher et al.

(10) Patent No.: US 9,082,719 B2
(45) Date of Patent: Jul. 14, 2015

(54) METHOD FOR REMOVING A DIELECTRIC LAYER FROM A BOTTOM OF A TRENCH

(71) Applicant: Infineon Technologies AG, Neubiberg (DE)

(72) Inventors: Lothar Brencher, Radeberg (DE); Carsten Moritz, Radeberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/656,407

(22) Filed: Oct. 19, 2012

(65) Prior Publication Data

US 2014/0110374 A1 Apr. 24, 2014

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| H01B 13/00 | (2006.01) |
| H01L 21/311 | (2006.01) |
| H01L 21/768 | (2006.01) |

(52) U.S. Cl.
CPC .... H01L 21/31116 (2013.01); H01L 21/76898 (2013.01); *H01L 21/76844* (2013.01)

(58) Field of Classification Search
CPC ............. H01L 21/31116; H01L 21/3065; H01L 21/32136; H01L 21/76844
USPC .................................. 216/67, 17, 37
See application file for complete search history.

(56) References Cited

U.S. PATENT DOCUMENTS

| | | | |
|---|---|---|---|
| 4,784,402 A | 11/1988 | Roman | |
| 4,855,017 A | 8/1989 | Douglas | |
| 6,037,276 A * | 3/2000 | Lin et al. | 438/786 |
| 6,498,091 B1 | 12/2002 | Chen | |
| 7,332,428 B2 | 2/2008 | Beck | |
| 7,547,635 B2 * | 6/2009 | Eppler et al. | 438/710 |
| 2008/0057729 A1* | 3/2008 | Shen et al. | 438/735 |
| 2009/0286400 A1* | 11/2009 | Heo et al. | 438/694 |

FOREIGN PATENT DOCUMENTS

DE 103 45 402 B4 10/2005

OTHER PUBLICATIONS

"Oxynitride", Wikipedia webpage.*

* cited by examiner

*Primary Examiner* — Binh X Tran
*Assistant Examiner* — Thomas Pham
(74) *Attorney, Agent, or Firm* — Slater & Matsil, L.L.P.

(57) ABSTRACT

Embodiments provide a method for removing a dielectric layer from a bottom of a trench while maintaining the dielectric layer on sidewalls of the trench. The method includes etching the dielectric layer at the bottom of the trench and generating a passivation layer on the dielectric layer at an upper portion of the trench by adjusting the conditions of a plasma etch process to a first mode; and a step of etching the dielectric layer at the bottom of the trench and etching the passivation layer at the upper portion of the trench by adjusting the conditions of the plasma etch process to a second mode before the dielectric layer at the bottom of the trench is completely removed.

12 Claims, 14 Drawing Sheets

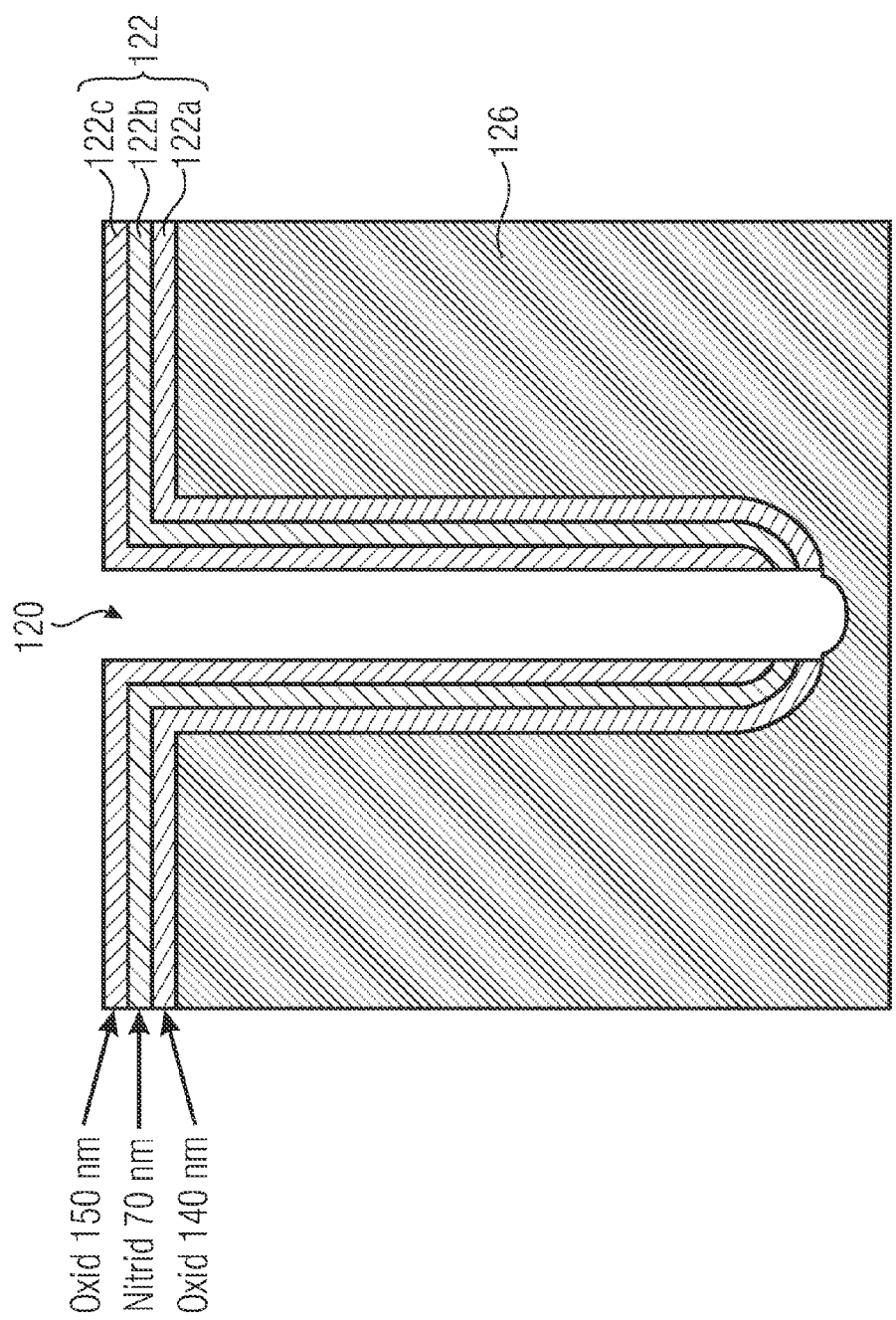

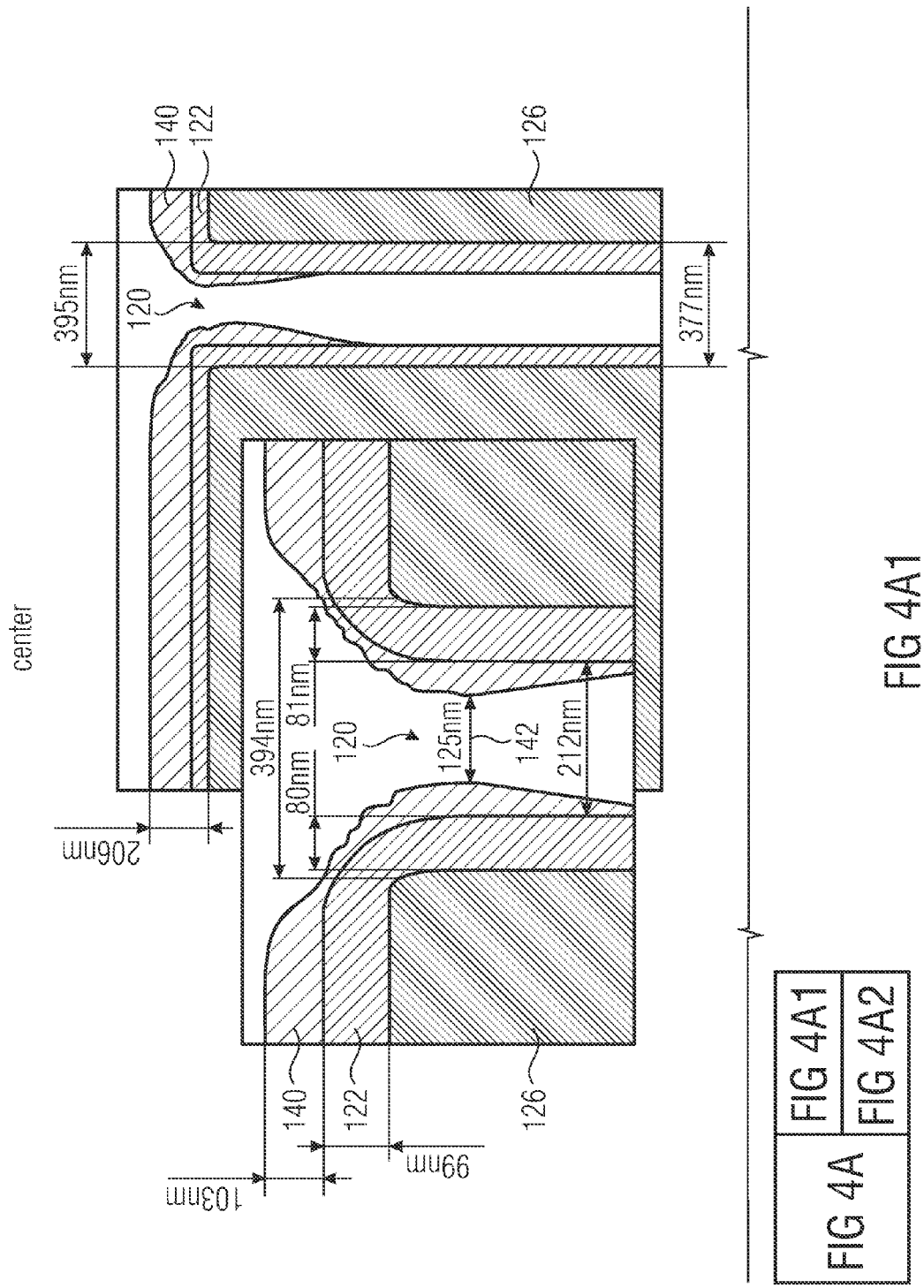

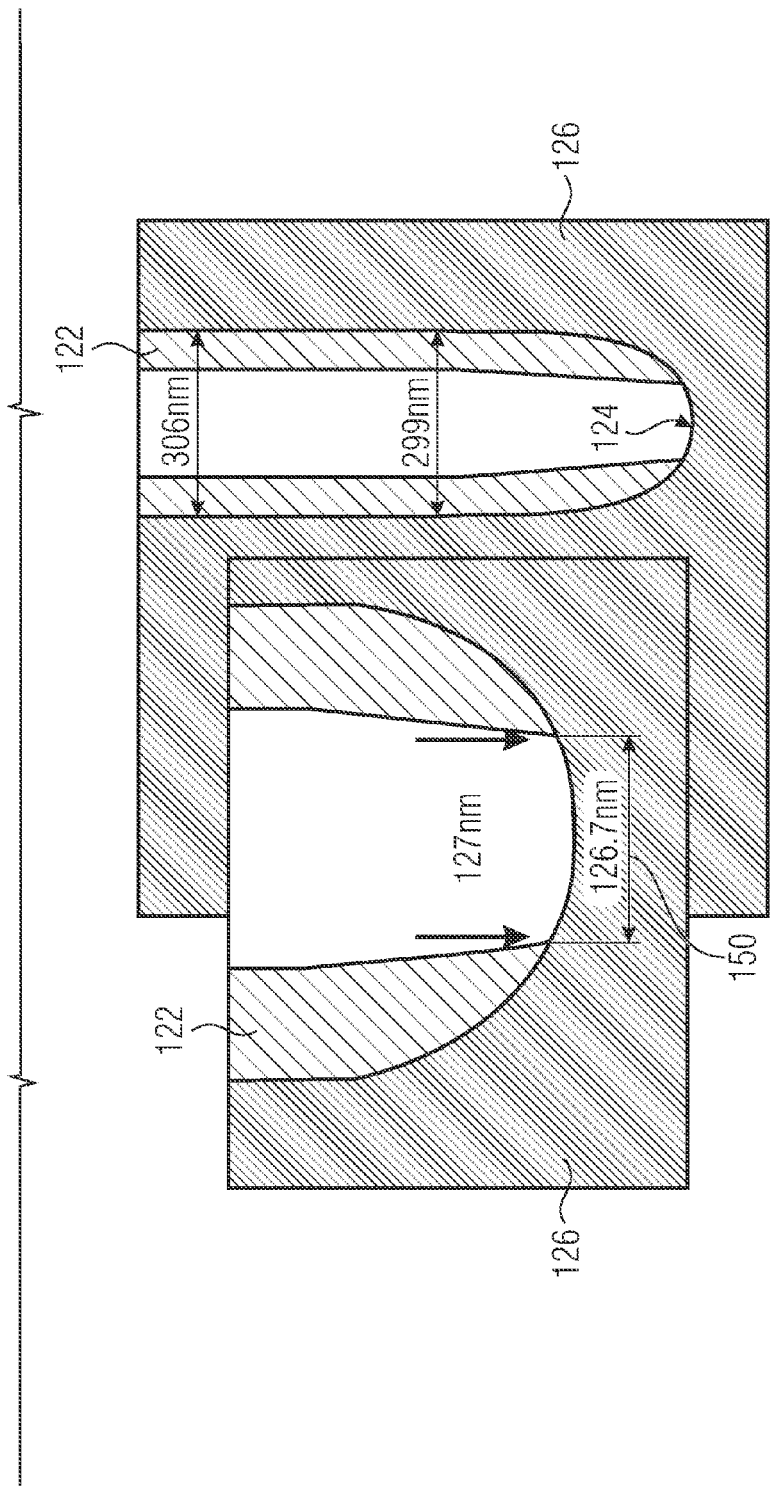

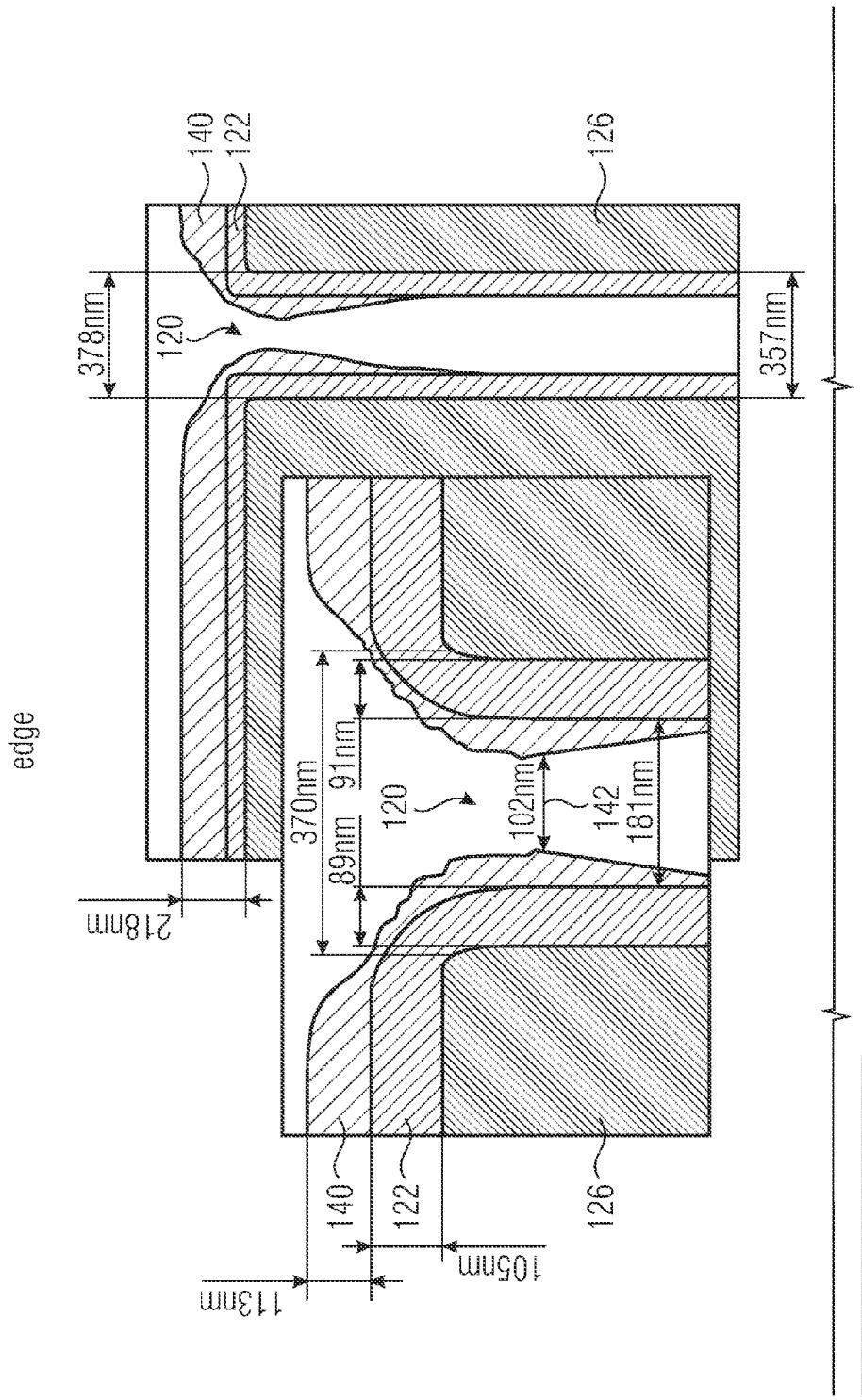

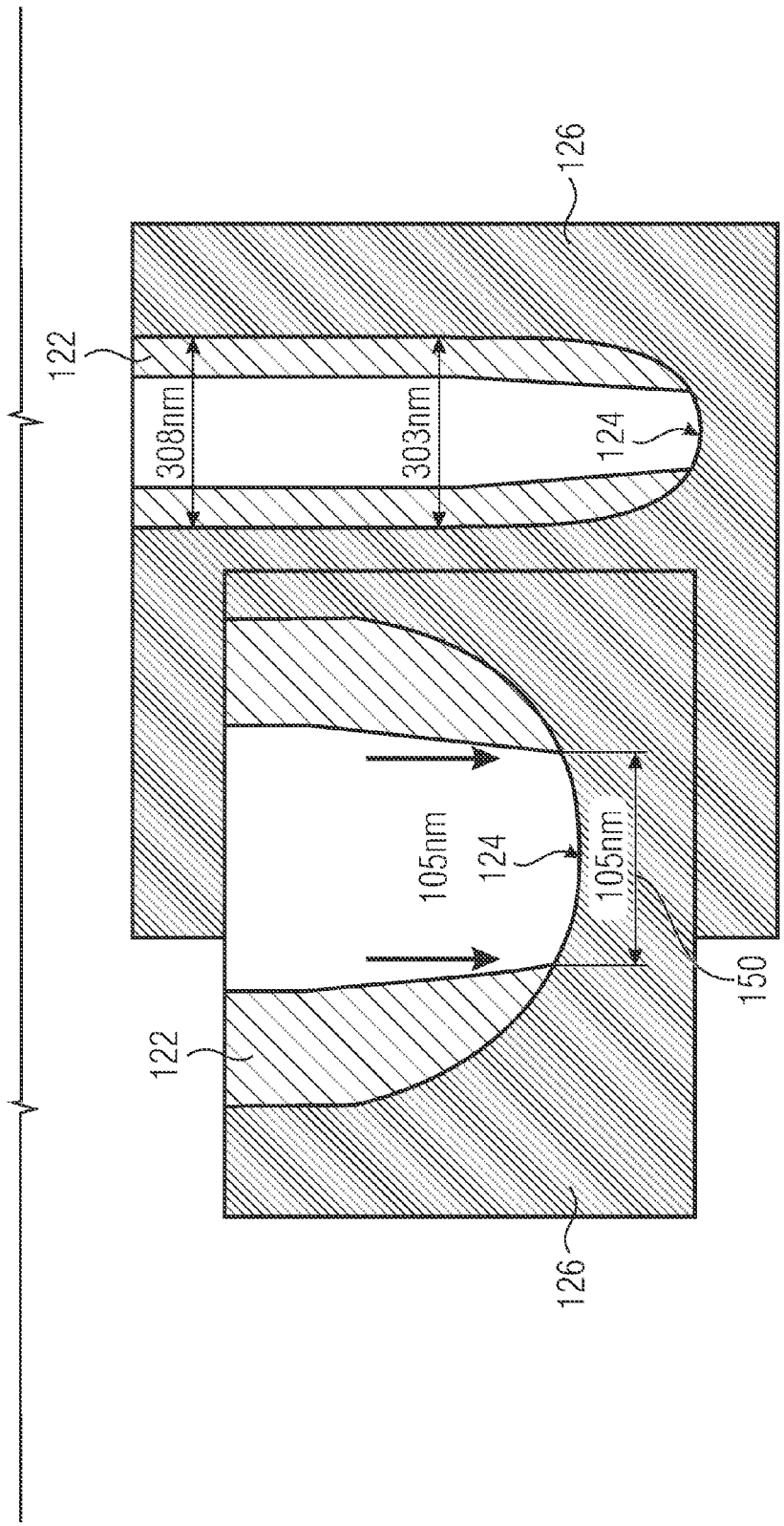
FIG 4B2

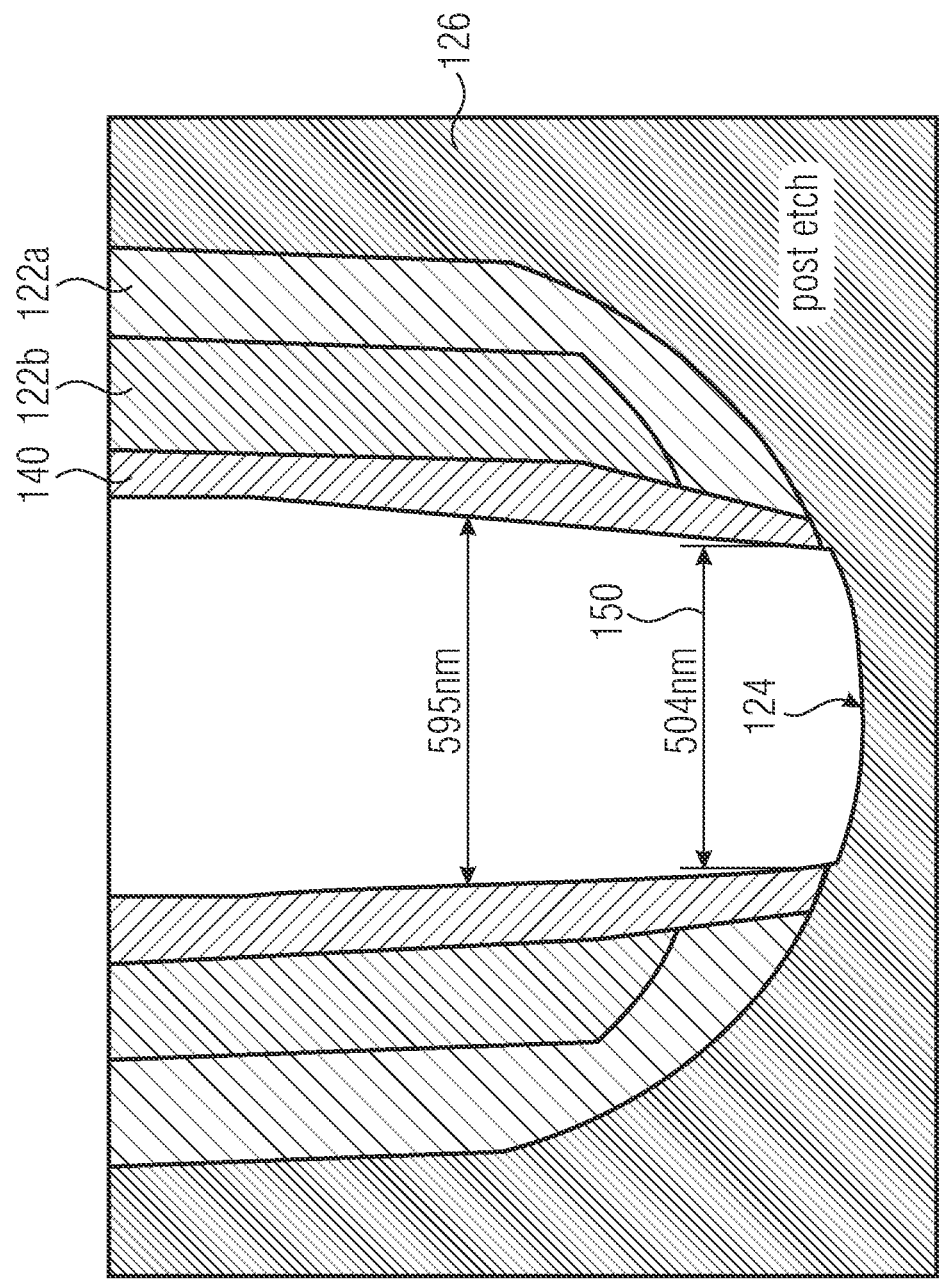

METHOD FOR REMOVING A DIELECTRIC LAYER FROM A BOTTOM OF A TRENCH

TECHNICAL FIELD

Embodiments relate to a method for removing a dielectric layer from a bottom of a trench while maintaining the dielectric layer on sidewalls of the trench. Some embodiments relate to a combined in situ etch/deposition application.

BACKGROUND

Several power devices are designed with deep trench formations in order to reduce chip size. Usually, the trench will be covered with a dielectric layer (e.g., oxide or nitride) for electrical isolation. Afterwards, the dielectric layer has to be removed at the bottom of the trench to enable electrical contact from the backside of the wafer. Mostly, from device point of view it is mandatory to leave the dielectric layer at the top of the trench. Unfortunately, the etch rate at top is always higher than on bottom due to ARDE (ARDE=aspect ratio depended etching).

SUMMARY OF THE INVENTION

Embodiments provide a method for removing a dielectric layer from a bottom of a trench while maintaining the dielectric layer on sidewalls of the trench. The method comprises etching the dielectric layer at the bottom of the trench and generating a passivation layer on the dielectric layer at an upper portion of the trench by adjusting the conditions of a plasma etch process to a first mode. Furthermore, the method comprises etching the dielectric layer at the bottom of the trench and etching the passivation layer at the upper portion of the trench by adjusting the conditions of the plasma etch process to a second mode before the dielectric layer at the bottom of the trench is completely removed.

Further embodiments provide a method for removing a dielectric layer from a bottom of a trench formed in a substrate while maintaining the dielectric layer on sidewalls of the trench and on a surface of the substrate by means of a plasma etch process using $C_xF_y$ and $O_2$. The method comprises etching the dielectric layer at the bottom of the trench and generating a passivation layer on the dielectric layer at an upper portion of the trench and on the dielectric layer at the surface of the substrate by adjusting a ratio between $C_xF_y$ and $O_2$ to a first mode. Furthermore, the method comprises etching the dielectric layer at the bottom of the trench and etching the passivation layer at the upper portion of the trench and at the surface of the substrate by adjusting the ratio between $C_xF_y$ and $O_2$ to a second mode. Moreover, the method comprises repeatedly changing between the modes until the dielectric layer at the bottom of the trench is completely removed.

BRIEF DESCRIPTION OF THE DRAWINGS

Embodiments of the present invention are described herein making reference to the appended drawings.

FIG. 3 shows a cross-sectional view of a trench before removing a dielectric layer from a bottom of the trench;

FIG. 4a shows cross-sectional views of a trench after removing a dielectric layer from a bottom of the trench, wherein the trench is formed in a substrate near a center of a wafer;

FIG. 4b shows cross-sectional views of a trench after removing a dielectric layer from a bottom of the trench, wherein the trench is formed in the substrate near an edge of the wafer;

FIG. 5d shows a cross-sectional view of a lower portion of the trench shown in FIG. 5b.

Figure 1:
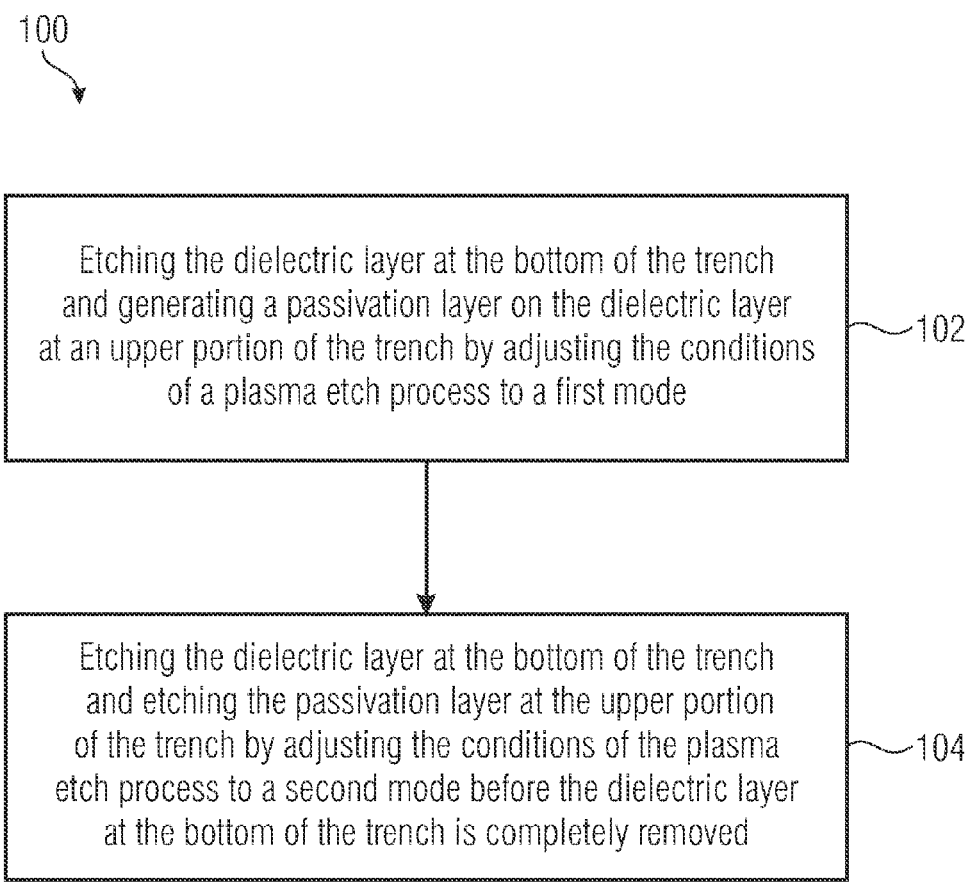
FIG. 1 shows a flow chart of method for removing a dielectric layer from a bottom of a trench according to an embodiment.

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In addition, features of the different embodiments described hereinafter may be combined with each other, unless specifically noted otherwise.

FIG. 1 shows a flow chart of a method 100 for removing a dielectric layer from a bottom of a trench while maintaining the dielectric layer on sidewalls of the trench. The method comprises a step 102 of etching the dielectric layer at the bottom of the trench and generating a passivation layer on the dielectric layer at an upper portion of the trench by adjusting the conditions of a plasma etch process to a first mode. Furthermore, the method 100 comprises a step 104 of etching the dielectric layer at the bottom of the trench and etching the passivation layer at the upper portion of the trench by adjusting the conditions of the plasma etch process to a second mode before the dielectric layer at the bottom of the trench is completely removed.

In embodiments, the conditions of the running plasma etch process are adjusted in the step 102 to a first mode in which the dielectric layer (e.g., oxide or nitride) at the bottom of the trench is etched while a passivation layer is generated on the dielectric layer at an upper portion of the trench. Thus, instead of simultaneously etching the dielectric layer at the bottom of the trench and at the sidewalls of the trench, a passivation layer (e.g., a polymer layer) is generated at the upper portion of the trench. Furthermore, before the dielectric layer at the bottom of the trench is completely removed, the conditions of the running plasma etch process are adjusted in the step 104 to a second mode in which the dielectric layer at the bottom of the trench and the passivation layer at the upper portion of the trench are etched. Thereby, the dielectric layer at the upper portion of the trench is protected by the before generated passivation layer while the dielectric layer at the bottom of the trench is etched.

In some embodiments, the method 100 further comprises changing between the modes at least twice.

For example, changing between the modes at least twice may include changing from the first mode to the second mode and changing from the second mode back to the first mode. Similarly, changing between the modes at least twice may also include changing from the second mode to the first mode and changing from the first mode back to the second mode.

Naturally, it also can be changed more than two times between the modes (first mode and second mode), i.e., three, four, five, six, seven, eight, nine, ten or even more times. In other words, the method 100 can comprise changing between the modes n times, wherein n is a natural number greater than or equal to two (n≥2).

The first mode can be a combination of an etch mode of the dielectric layer at the bottom of the trench (e.g., etch mode at bottom) and a deposition mode of the passivation layer on the dielectric layer at the upper portion of the trench (e.g., deposition mode on top), wherein the second mode can be a combination of an etch mode of the dielectric layer at the bottom of the trench and an etch mode of the passivation layer at the upper portion of the trench (e.g., etch mode at top and bottom).

Note that the plasma etch process does not have to be adjusted to exactly the same conditions each time it is changed back to the respective mode. It is only relevant that the conditions of the plasma etch process are adjusted in the first mode such that the dielectric layer at the bottom of the trench is etched while the passivation layer is generated on the dielectric layer at the upper portion of the trench, and that the conditions of the plasma etch process are adjusted in the second mode such that the dielectric layer at the bottom of the trench and the passivation layer at the upper portion of the trench are etched.

For example, the conditions of the plasma etch process may be adjusted by setting a ratio between the gases used for the plasma etch process. In that case, the ratio between the gases may vary (slightly) each time it is changed back to the respective mode, for example, the ratio may vary between 1:1, 1:0.9 and 1:1.1 when changing back to the first mode, and between 1:2, 1:1.9 and 2.1 when changing back to the first mode.

Naturally, the plasma etch process also can be adjusted to the same conditions when changing back to the respective mode.

In some embodiments, the conditions of the plasma etch process can be changed between the modes until the dielectric layer at the bottom of the trench is completely removed or even until an over etch of the dielectric layer at the bottom of the trench is achieved.

In the following, embodiments and implementation examples of the method 100 for removing a dielectric layer from a bottom of a trench while maintaining the dielectric layer on sidewalls of the trench are described in further detail with respect to FIGS. 2a to 2c.

Figure 2A:
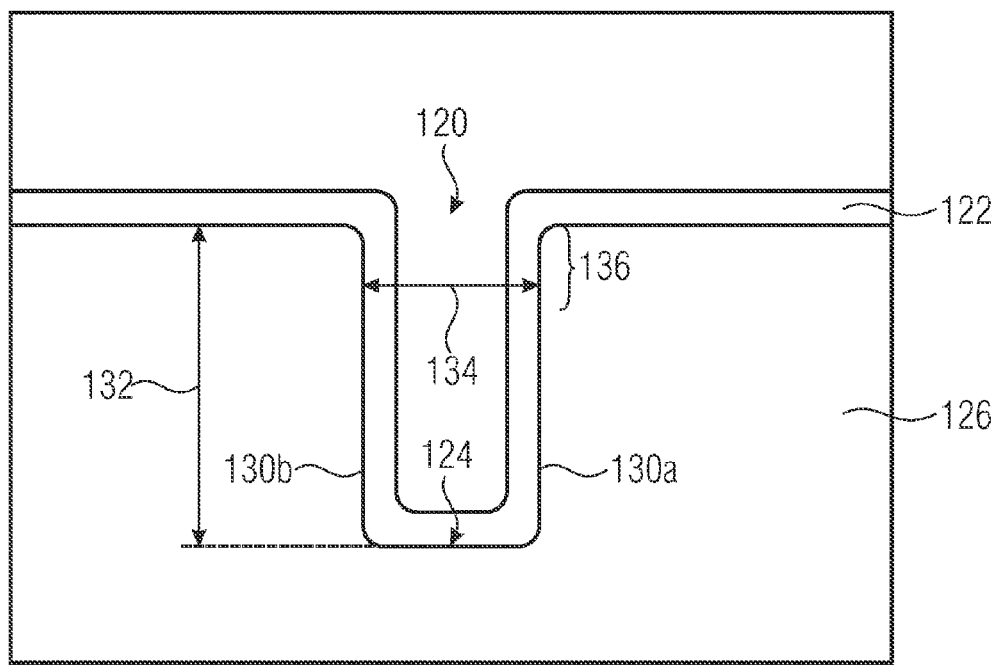
FIG. 2a shows a cross-sectional view of a trench before removing a dielectric layer from a bottom of the trench.

FIG. 2a shows a cross-sectional view of a trench 120 before applying the method 100 for removing a dielectric layer 122 from a bottom 124 of the trench 120.

As shown in FIG. 2a, the trench 120 can be formed in a substrate 126 from a surface 128 of the substrate 126 in a depth direction, wherein the bottom 124 of the trench 120, sidewalls 130 of the trench 120 and the surface 128 of the substrate 126 can be covered with the dielectric layer 122.

The trench 120 can comprise a depth 132 (e.g., along the depth direction of the substrate 126) and a width 134 (e.g., perpendicular to the depth direction and/or (substantially) parallel to the surface 128 of the substrate 126), wherein the depth 132 is usually greater than the width 134. For example the depth 132 can be by a factor of 3, 5, 10, 15, 20, 30, 40, 50, 60 or even more greater than the width 134.

The upper portion 136 of the trench 120 may extend from the top of the trench 120 (e.g., surface 128 of the substrate) along the depth direction, e.g., up to 10%, 20%, 30%, 40% or 50% of the depth 132 of the trench 120.

Figure 2B:
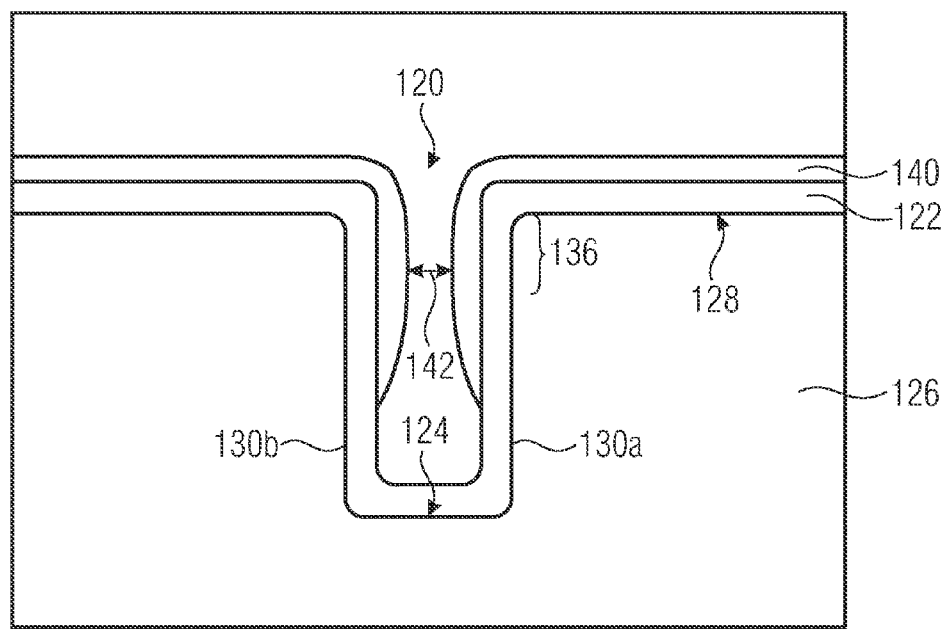
FIG. 2b shows a cross-sectional view of the trench after etching the dielectric layer at the bottom of the trench and generating a passivation layer on the dielectric layer at an upper portion of the trench.

FIG. 2b shows a cross-sectional view of the trench 120 after the step 102 of the method 100 for removing a dielectric layer 122 from a bottom 124 of the trench 120.

In the first mode, the conditions of the plasma etch process can be adjusted to etch the bottom 124 of the trench 120 and to generate the passivation layer 140 on the dielectric layer 122 at the upper portion 136 of the trench 120 and optionally on the surface 128 of the substrate 126.

Thereby, the dielectric layer 122 at the bottom of the trench 120 gets thinner, while the passivation layer 140 on the dielectric layer 122 at the upper portion 136 of the trench 120 and on the surface 128 of the substrate 126 gets thicker.

Nevertheless, the generation of the passivation layer 140 leads to a reduction of a gap 142 between opposing portions of the passivation layer 140 at the upper portion 136 of the trench 120. If the gap 142 becomes too small, then the etching of the dielectric layer 122 at the bottom of the trench 120 is hindered.

Thus, in some embodiments, the method 100 can comprise the step of changing the conditions of the plasma etch process to the second mode before the gap 142 between the portions of the passivation layer 140 generated on the dielectric layer 122 on opposing sidewalls 130a and 130b at the upper portion 136 of the trench 120 is reduced to the extent that etching the dielectric layer 122 at the bottom 124 of the trench 120 is impaired.

Figure 2C:
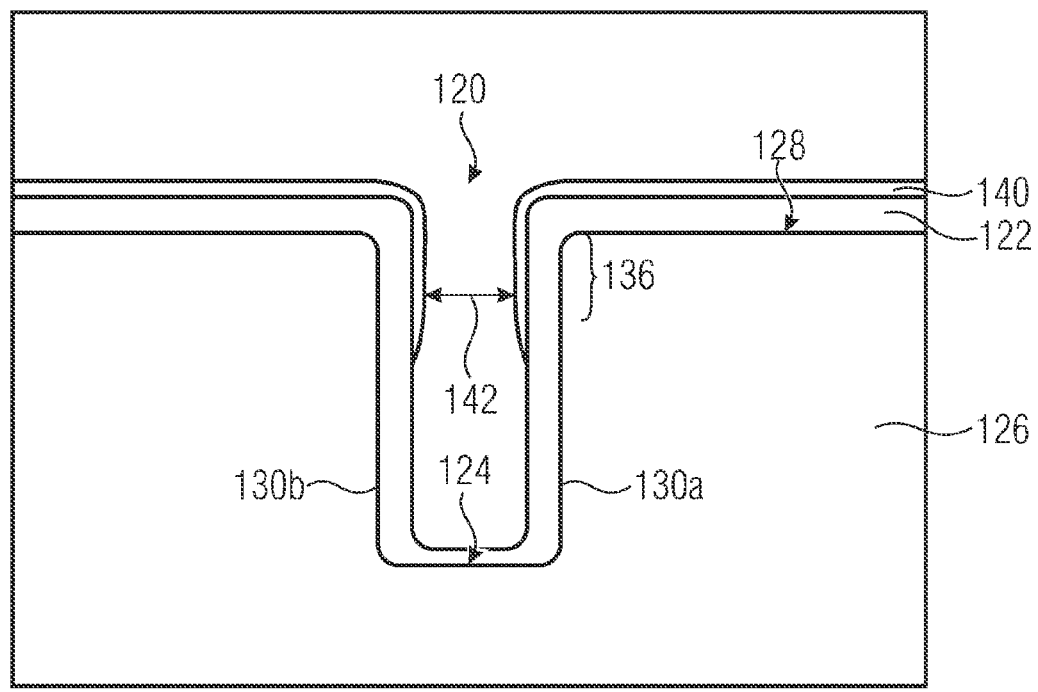
FIG. 2c shows a cross-sectional view of the trench after etching the dielectric layer at the bottom of the trench and etching the passivation layer at the upper portion of the trench.

FIG. 2c shows a cross-sectional view of the trench 120 after the step 104 of the method 100 for removing a dielectric layer 122 from a bottom 124 of the trench 120.

In the second mode, the conditions of the plasma etch process can be adjusted to etch the dielectric layer 122 at the bottom 124 of the trench 120 and to etch the passivation layer 140 at the upper portion 136 of the trench 120 and optionally at the surface 128.

Thereby, the thickness of the dielectric layer 122 at the bottom 124 of the trench 120 is further reduced. In addition, the thickness of the passivation layer 140 is reduced.

In some embodiments, the method 100 can comprise changing the conditions of the plasma etch process to the first mode before the passivation layer 140 on the dielectric layer 122 at the upper portion of the trench is removed up to the dielectric layer.

As already mentioned, the method 100 can comprise changing between the first mode and the second mode (or between the second mode and the first mode) at least twice.

Thereby, changing between the modes may include at least one of the following. First, changing a gas of the plasma etch process. Second, changing a ratio between gases of the plasma etch process. Third, changing a RF-power for generating the plasma of the plasma etch process. Fourth, changing a pressure of the plasma etch process.

According to some embodiments, $C_xF_y$ and $O_2$ can be used for the plasma etch process. In that case, changing the ratio between gases of the plasma etch process may comprise changing the ratio between $C_xF_y$ and $O_2$. $C_xF_y$ can be, for example, $C_5F_8$ (octafluorocyclopentene), $C_4F_6$ (hexafluorobutadiene) or $C_3F_8$ (octafluoropropane).

The ratio between $C_xF_y$ and $O_2$ can be the ratio between the flowing gas volume per time unit of $C_xF_y$ and the flowing gas volume per time unit of $O_2$. Moreover, the ratio between $C_xF_y$ and $O_2$ can be the ratio between the concentration of $C_xF_y$ and the concentration of $O_2$.

For example, in the first mode the ratio between the flowing gas volumes per time unit of $C_xF_y$ and $O_2$ can be set to 1:1 (or between 1:0.7 to 1:1.3 or between 1:0.9 and 1:1.1), wherein in the second mode the ratio between the flowing gas volumes per time unit of $C_xF_y$ and $O_2$ can be set to 1:2 (or between 1:1.7 to 1:2.3 or between 1:1.9 to 1:2.1).

Note that $C_xF_y$ and $O_2$ also can be combined with other gases such as Ar.

After completely removing the dielectric layer 122 at the bottom 124 of the trench 120, the conditions of the plasma etch process can be adjusted to a third mode to etch the passivation layer 140 while maintaining the dielectric layer 122.

For example, the conditions of the plasma etch process can be adjusted to the third mode by changing the gas used for the plasma etch process to $O_2$. Thus, a $O_2$-flash can be used to remove the passivation layer 144.

In other words, embodiments allow clearing the bottom 124 of the trench 120 from the dielectric layer 122 without significant loss at top. Using special chemical ratio between $C_xF_y$ and $O_2$ together with certain RF-Power set up an additional layer (or passivation layer) 140 comprising polymers can be realized at the top of the trench 120 (deposition mode at top) while at the bottom 124 of the trench 120 the dielectric layer 122 is etched (etch mode at bottom). The thickness of the polymer layer 140 is corresponding to the process time. Depending on the dimensions the process can be stopped before the top of the trench 120 is getting overgrown. By changing the chemical ratio the polymer layer 140 can be removed while the dielectric layer 122 at the bottom 124 is still etched (etch mode at top and bottom). Applying deposition and etch mode several time thick dielectric layers 122 can be etched at the bottom 124 of the trench without thinning the dielectric layer 122 at top.

Embodiments provide several advantages, such as the possibility to etch the dielectric layer 122 at the bottom 124 of a deep trench 120 without thinning the dielectric layer 122 at top, and the potential to etch different material stack (e.g., oxide/nitride/oxide) as will become clear from the following description.

FIG. 3 shows a cross-sectional view of a trench 120 after applying the method for removing a dielectric layer 122 from a bottom 124 of the trench 120. As shown in FIG. 3, the dielectric layer 122 can comprise a plurality of stacked sub layers 122a to 122c. Thereby, the dielectric layer 122 can comprise a first oxide sub layer 122a (e.g., having a thickness of 140 nm), a nitride sub layer 122b (e.g., having a thickness of 70 nm) and a second oxide sub layer 122c (e.g., having a thickness of 150 nm) as the plurality of stacked sub layers 122a to 122c.

The method 100 for removing a dielectric layer 122 from a bottom 124 of a trench 120, or in other words, the combined in situ etch/deposition application, provides a comfortable process window. It was tested for aspect ratios (ratio between the depth 132 and the width 134 of the trench 120) between 5:1 and 40:1, for top CD (CD=critical dimension) from 70 nm up to 3 µm, and for a DT depth (DT=deep trench) from 1.5 µm up to 55 µm. Moreover, a variable change between deposition step (first mode) and etch step (second mode) is possible, the polymer 140 build-up can be removed easily by an in situ clean step, and the risk of defect density is low.

FIG. 4a shows cross-sectional views of a trench 120 after removing the dielectric layer 122 from the bottom 124 of the trench 120, wherein the trench 120 is formed in a substrate 126 near a center of a wafer.

FIG. 4b shows cross-sectional views of a trench 120 after removing the dielectric layer 122 from the bottom 124 of the trench 120, wherein the trench 120 is formed in a substrate 126 near an edge of the wafer.

Figure 4C:
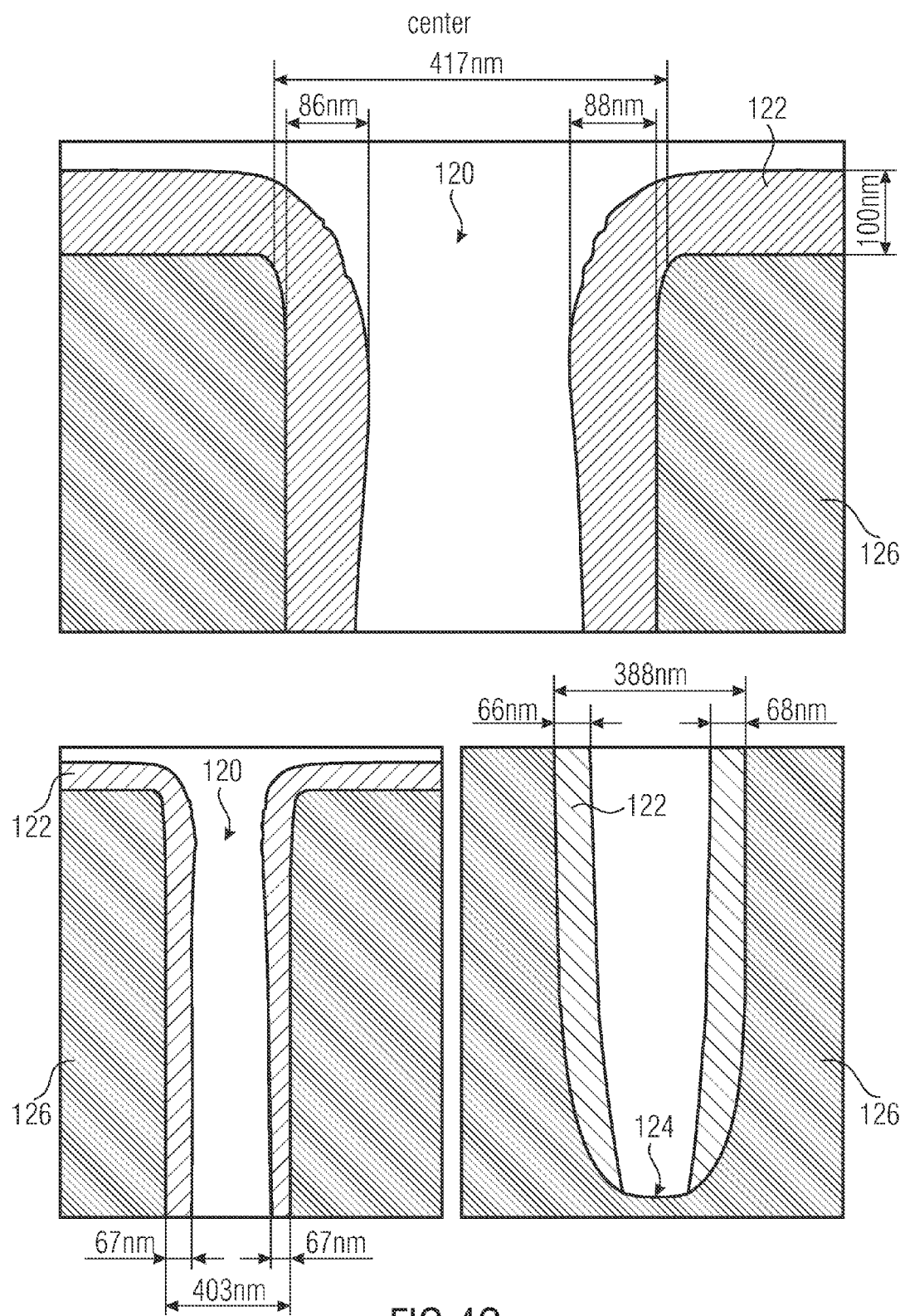
FIG. 4c shows cross-sectional views of a trench after removing a passivation layer, wherein the trench is formed in a substrate near a center of the wafer.

FIG. 4c shows cross-sectional views of a trench 120 after removing the passivation layer 140, wherein the trench 120 is formed in a substrate 126 near a center of a wafer.

Figure 4D:
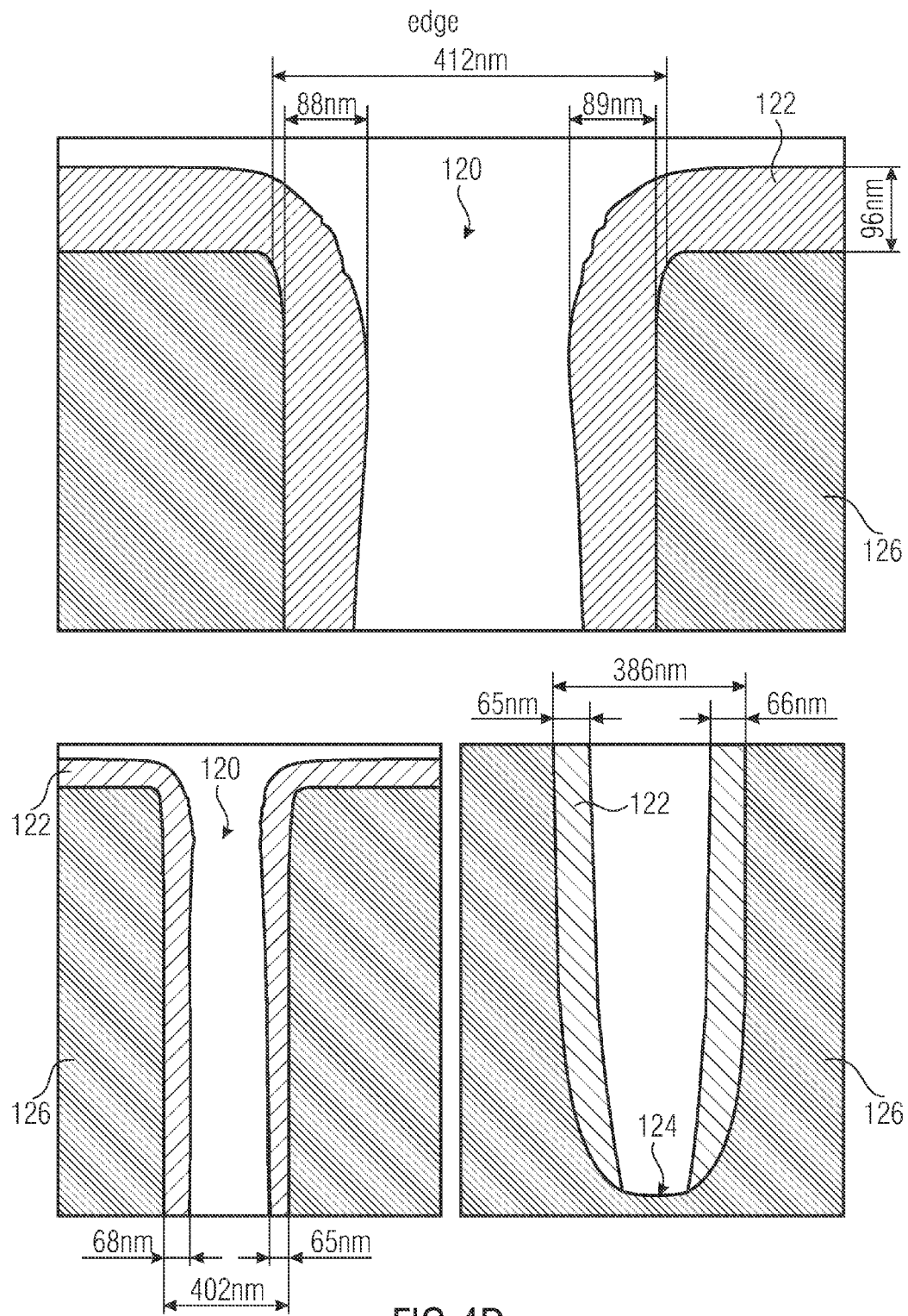
FIG. 4d shows cross-sectional views of a trench after removing a passivation layer, wherein the trench is formed in the substrate near an edge of the wafer.

FIG. 4d shows cross-sectional views of a trench 120 after removing the passivation layer 140, wherein the trench 120 is formed in a substrate 126 near an edge of the wafer.

As shown in FIGS. 4a to 4d, differences between dimensions of the trenches 120 and between thicknesses of the dielectric layers 122 and of the passivation layers 140 caused by non-uniformities of the plasma etch process between the center of the wafer and the edge of the wafer are minor.

For example, the gap 142 between opposing portions of the passivation layer 140 at the upper portion 136 of the trench 120 amounts to 125 nm for the trench 120 located near the center of the wafer and to 102 nm for the trench 120 located near the edge of the wafer. Moreover, the distance 150 between opposing portions of the dielectric layer 122 at the bottom of the trench 120 amounts to 126.7 nm for the trench 120 located near the center of the wafer and to 105 nm for the trench 120 located near the edge of the wafer.

As can be gathered from FIGS. 4c and 4d, no subsequent polymer removal is necessary due to an $O_2$-flash. Furthermore, only a small Ox-retract at the trench top (e.g., ~30 nm) may occur. In addition, the trench is well opened at the bottom and no oxide remains on top.

Figure 5A:
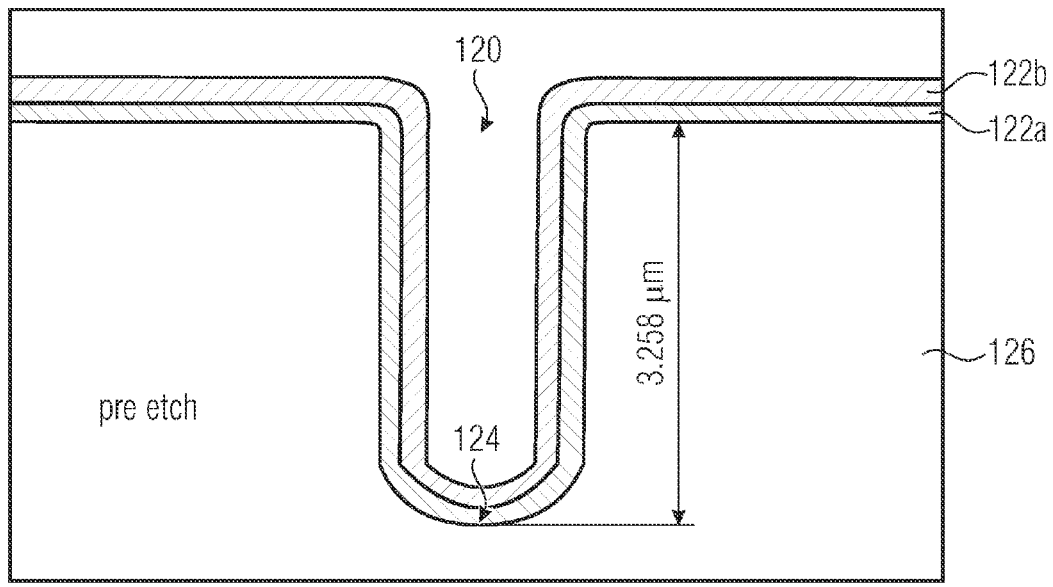
FIG. 5a shows a cross-sectional view of a trench before removing a dielectric layer from a bottom of the trench.

FIG. 5a shows a cross-sectional view of a trench 120 before removing the dielectric layer 122 from the bottom 124 of the trench 120. The dielectric layer 122 comprises a plurality of stacked sub layers 122a and 122b.

Figure 5B:
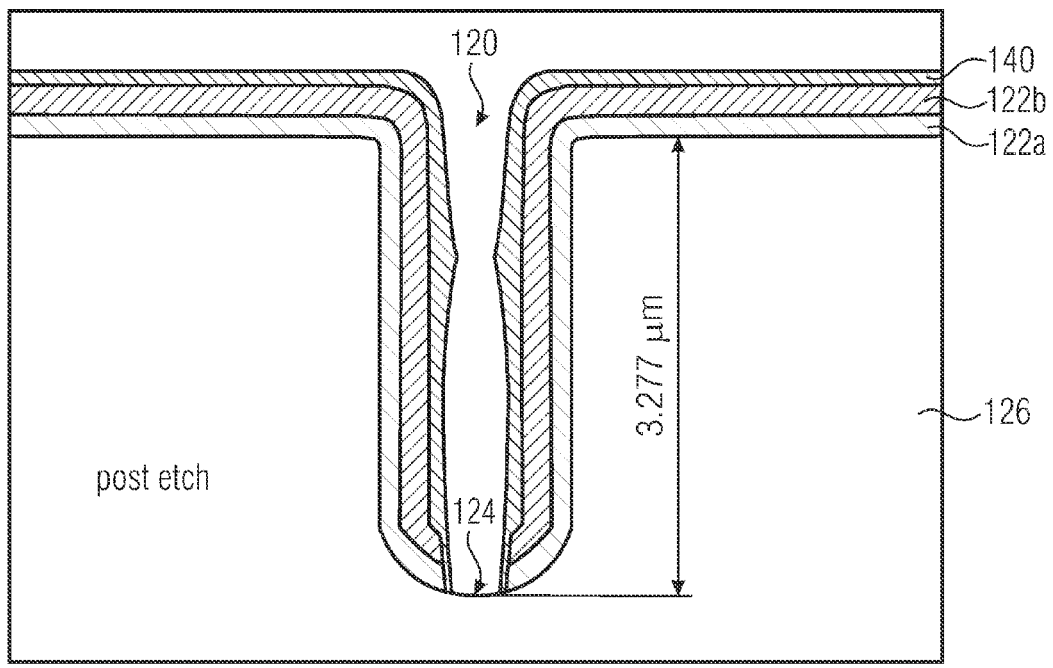
FIG. 5b shows a cross-sectional view of the trench after removing the dielectric layer from the bottom of the trench.

FIG. 5b shows a cross-sectional view of the trench 120 after removing the dielectric layer 122 from the bottom 124 of the trench 120. As indicated in FIG. 5b, an over etch of the dielectric layer 122 at the bottom 124 of the trench is achieved.

Figure 5C:
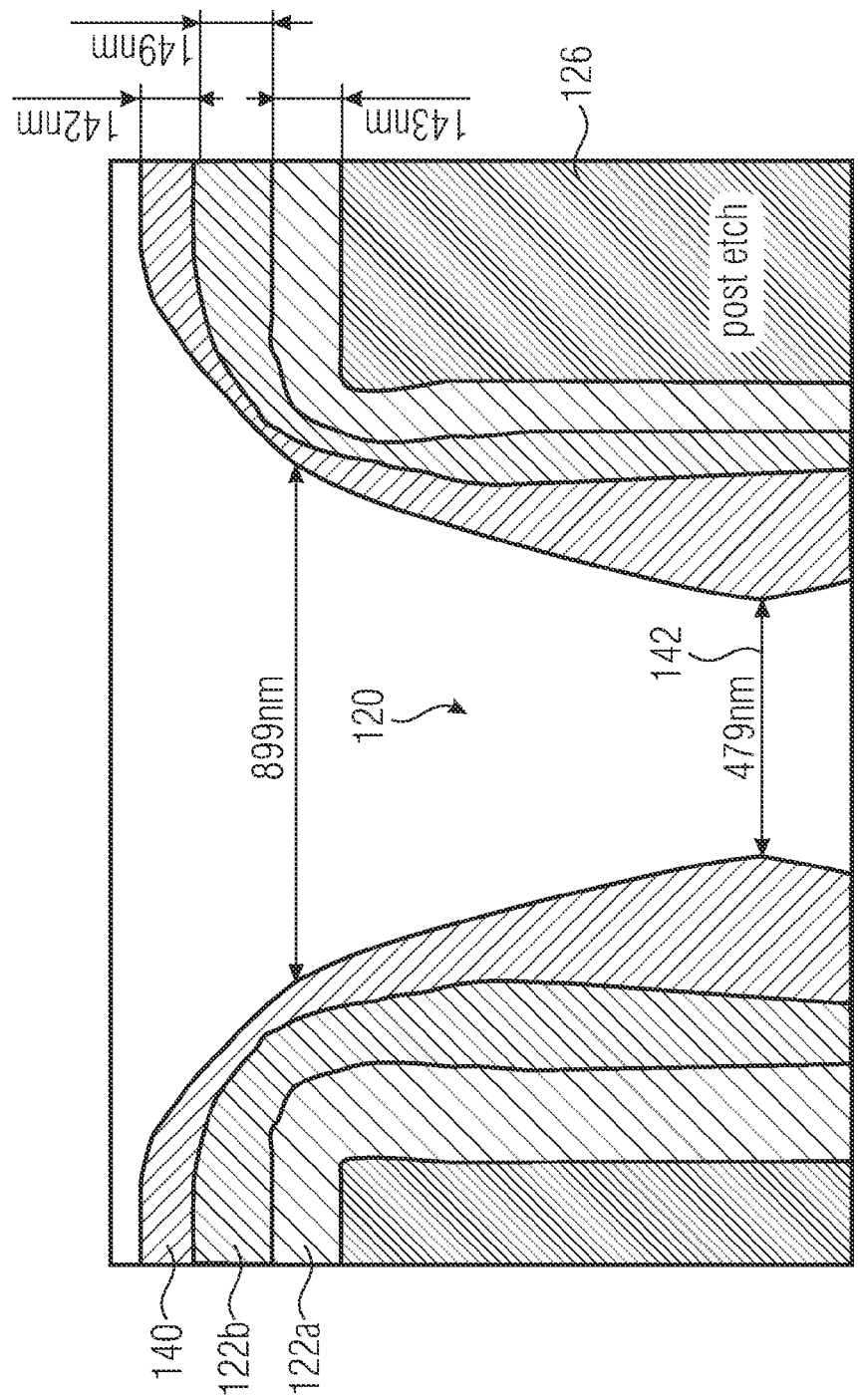
FIG. 5c shows a cross-sectional view of an upper portion of the trench shown in FIG. 5b.

FIG. 5c shows a cross-sectional view of an upper portion of the trench 120 shown in FIG. 5b.

FIG. 5c shows a cross-sectional view of a lower portion of the trench 120 shown in FIG. 5b.

As exemplarily indicated in FIGS. 5a to 5d, the trench can comprise a depths of 3258 µm, wherein the width 150 between opposing portions of the dielectric layer 122 at the bottom 124 of the trench can 120 amount to 504 nm, and wherein the gap 142 between opposing portions of the passivation layer 140 at the upper portion 136 of the trench 120 can amount to 479 nm.

Note that the dimensions are indicated in FIGS. 4a to 5d only for illustration purposes and should therefore not be considered limiting or interpreted restrictively.

Further embodiments provide a method comprising a step of removing a dielectric layer at the bottom of deep trench without thinning top layer; a step of building up an in situ top protection layer (polymers) that is used as mask for further etch steps; and a step of switching between deposition and etch step. Thereby, multiple dielectric layer can be etched without touching top dielectric layer.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for removing a dielectric layer from a bottom of a trench while maintaining the dielectric layer on sidewalls of the trench, the method comprising:
   providing a substrate, wherein the trench is formed in the substrate, and wherein the bottom of the trench and the sidewalls of the trench are covered with the dielectric layer;
   etching the dielectric layer at the bottom of the trench and generating a passivation layer on the dielectric layer at an upper portion of the trench by adjusting conditions of a plasma etch process to a first mode; and
   etching the dielectric layer at the bottom of the trench and etching the passivation layer at the upper portion of the trench by adjusting the conditions of the plasma etch process to a second mode before the dielectric layer at the bottom of the trench is completely removed,
   wherein the dielectric layer comprises nitride.

2. The method according to claim 1, wherein the method further comprises changing between the modes at least twice.

3. The method according to claim 2, wherein changing between the modes include at least one of the following:
   changing a gas of the plasma etch process;
   changing a ratio between gases of the plasma etch process;
   changing a RF-power for generating the plasma of the plasma etch process; or changing a pressure of the plasma etch process.

4. The method according to claim 3, wherein $C_xF_y$ and $O_2$ is used in the plasma etch process, wherein changing the ratio between gases of the plasma etch process comprises changing the ratio between $C_xF_y$ and $O_2$, wherein $C_xF_y$ is one out of $C_5F_8$, $C_4F_6$ and $C_3F_8$.

5. The method according to claim 1, wherein the method comprises etching the passivation layer while maintaining the dielectric layer by adjusting the conditions of the plasma etch process to a third mode after completely removing the dielectric layer at the bottom of the trench.

6. The method according to claim 5, wherein adjusting the conditions of the plasma etch process to the third mode includes changing a gas used for the plasma etch process to $O_2$.

7. The method according to claim 1, wherein the conditions of the plasma etch process are changed between the modes until the dielectric layer at the bottom of the trench is completely removed.

8. The method according to claim 1, wherein the conditions of the plasma etch process are changed between the modes until an over etch of the dielectric layer at the bottom of the trench is achieved.

9. The method according to claim 1, wherein the conditions of the plasma etch process are changed to the second mode before a gap between portions of the passivation layer generated on the dielectric layer on opposing sidewalls at the upper portion of the trench is reduced to the extent that etching the dielectric layer at the bottom of the trench is impaired.

10. The method according to claim 1, wherein the conditions of the plasma etch process are changed to the first mode before the passivation layer on the dielectric layer at the upper portion of the trench is removed.

11. The method according to claim 1, wherein the dielectric layer comprises a first oxide sub layer, a nitride sub layer and a second oxide sub layer as the plurality of stacked sub layers.

12. A method for removing a dielectric layer from a bottom of a trench while maintaining the dielectric layer on sidewalls of the trench, wherein the dielectric layer comprises a plurality of stacked sub layers, and wherein the sub layers comprise a first oxide sub layer, a nitride sub layer and a second oxide sub layer, the method comprising:
   providing a substrate, wherein the trench is formed in the substrate, and wherein the bottom of the trench and the sidewalls of the trench are covered with the dielectric layer;
   etching the dielectric layer at the bottom of the trench and generating a passivation layer on the dielectric layer at an upper portion of the trench by adjusting conditions of a plasma etch process to a first mode; and
   etching the dielectric layer at the bottom of the trench and etching the passivation layer at the upper portion of the trench by adjusting the conditions of the plasma etch process to a second mode before the dielectric layer at the bottom of the trench is completely removed.

* * * * *